(12) United States Patent
Eberhard et al.

(10) Patent No.: US 8,829,560 B2
(45) Date of Patent: Sep. 9, 2014

(54) OPTOELECTRONIC SEMICONDUCTOR CHIP AND METHOD FOR FABRICATING AN OPTOELECTRONIC SEMICONDUCTOR CHIP

(75) Inventors: Franz Eberhard, Regensburg (DE); Wolfgang Schmid, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 41 days.

(21) Appl. No.: 13/515,261

(22) PCT Filed: Dec. 8, 2010

(86) PCT No.: PCT/EP2010/069128
§ 371 (c)(1),
(2), (4) Date: Jun. 11, 2012

(87) PCT Pub. No.: WO2011/070047
PCT Pub. Date: Jun. 16, 2011

(65) Prior Publication Data
US 2012/0248494 A1 Oct. 4, 2012

(30) Foreign Application Priority Data
Dec. 11, 2009 (DE) .................... 10 2009 054 555

(51) Int. Cl.
*H01L 33/36* (2010.01)
*H01L 33/38* (2010.01)
*H01L 33/40* (2010.01)

(52) U.S. Cl.
CPC ............... *H01L 33/36* (2013.01); *H01L 33/38* (2013.01); *H01L 33/40* (2013.01)

USPC ......................................... 257/99; 257/E33.066

(58) Field of Classification Search
CPC ......... H01L 33/40; H01L 33/42; H01L 33/36; H01L 33/38
USPC ............. 257/99, 448, 459, E31.126, E33.066
See application file for complete search history.

(56) References Cited

U.S. PATENT DOCUMENTS

| 5,789,768 | A  | * | 8/1998  | Lee et al. .................... 257/96 |
| 6,495,862 | B1 | * | 12/2002 | Okazaki et al. ............... 257/103 |
| 6,512,248 | B1 |   | 1/2003  | Takeuchi et al. |
| 2004/0065891 | A1 |   | 4/2004  | Shakuda et al. |
| 2006/0237735 | A1 | * | 10/2006 | Naulin et al. .................... 257/98 |
| 2008/0135867 | A1 |   | 6/2008  | Feng et al. |
| 2009/0008668 | A1 |   | 1/2009  | Matsumura |
| 2009/0072257 | A1 |   | 3/2009  | Unno et al. |
| 2010/0213485 | A1 | * | 8/2010  | McKenzie et al. ............... 257/98 |
| 2010/0308358 | A1 | * | 12/2010 | Bae et al. ........................ 257/98 |
| 2012/0267677 | A1 | * | 10/2012 | Bae ................................. 257/99 |
| 2013/0214255 | A1 | * | 8/2013  | Hermes et al. .................. 257/40 |

FOREIGN PATENT DOCUMENTS

| EP | 0 554 512      | 6/1993  |
| WO | WO 02/13281    | 2/2002  |
| WO | WO 2004/112157 | 12/2004 |

* cited by examiner

Primary Examiner — Allan R Wilson
(74) Attorney, Agent, or Firm — Cozen O'Connor (57) ABSTRACT

An optoelectronic semiconductor chip, comprising: a radiation out-coupling side (102, 910); a contact connection (104, 1000); a metal contact material (210, 912) applied to the radiation out-coupling side (102, 910) and a metal conductive connection (106, 500, 914) applied to the contact material (210, 912) and which is connected to the contact connection (104, 1000).

8 Claims, 5 Drawing Sheets

OPTOELECTRONIC SEMICONDUCTOR CHIP AND METHOD FOR FABRICATING AN OPTOELECTRONIC SEMICONDUCTOR CHIP

RELATED APPLICATIONS

This is a U.S. national stage of application No. PCT/EP2010/069128, filed on Dec. 8, 2010. Priority is claimed on German Application No.: 10 2009 054 555.7 filed on Dec. 11, 2009, the content of which is hereby incorporated herein by reference.

FIELD OF THE INVENTION

The present invention relates to an optoelectronic semiconductor chip and to a method for fabricating an optoelectronic semiconductor chip.

BACKGROUND OF THE INVENTION

An optoelectronic semiconductor chip is a layer sequence, produced in a semiconductor process, on a substrate. A semiconductor, by way of example a III-V semiconductor, is provided in the process. Epitaxy layers that have grown on a substrate are possible as a semiconductor layer sequence. The substrate includes by way of example materials such as SiC, sapphire, Ge, Si, GaAs, GaN or GaP. The epitaxy layers comprise by way of example quaternary semiconductors, such as AlInGaN for a blue or green emission spectrum in the visible range, or AlInGaP for a green to red emission spectrum in the visible range. The semiconductors may likewise comprise emission spectra in the non-visible range, by way of example in the UV range. The epitaxy layer can comprise quinternary semiconductors. A semiconductor of this kind is by way of example AlGaInAsP which can be used for the emission of radiation in the infrared range.

The semiconductor layer sequence includes a suitable active zone for the production of electromagnetic radiation. The active zone can include a double heterostructure or a quantum well structure such as a single quantum well (SQW) or a multi quantum well (MQW) for the production of radiation.

An optimally homogenous current density in the active zone, by way of example at the pn junction, is desirable in a light-emitting diode (LED) for high efficiency (i.e. for a large ratio or emitted electromagnetic radiation to supplied power), for a long life and for homogeneous radiation. One problem in this connection is in particular a power supply from the side at which the light is out-coupled (radiation out-coupling side). A current injection on the radiation out-coupling side conventionally occurs by way of contact webs which are applied to the semiconductor. The electrical properties of an LED can be optimized by way of a dense network of contact webs. The webs are disadvantageous for the optical behavior of such a component, however, since they lead to shading and absorption. Since light covers relatively long distances in a thin film LED before it is out-coupled, light may be absorbed at the contact webs. The efficiency of the LED is reduced.

A further problem arises in that a drop in voltage occurs owing to the finite conductivity inside a contact web. A remaining forward voltage over the active zone varies over the chip surface as a result.

SUMMARY OF THE INVENTION

One object of the present invention is to provide an optoelectronic semiconductor chip with improved efficiency in the light out-coupling and to disclose a method for fabricating such a semiconductor chip.

This and other objects are obtained in accordance with an aspect of the present invention directed to an optoelectronic semiconductor chip, comprising a radiation out-coupling side; a contact connection; a metal contact material applied to the radiation out-coupling side; and a metal conductive connection applied to the contact material and which is connected to the contact connection.

Various embodiments of the optoelectronic semiconductor chip comprise a radiation out-coupling side and a contact connection. A metal contact material is applied to the radiation out-coupling side. The optoelectronic semiconductor chip comprises a metal conductive connection applied to the contact material and connected to the contact connection.

The connection is divided into two structures as a result of this construction on the radiation out-coupling side. The contact material is used to inject a current into the semiconductor layer sequence of the optoelectronic semiconductor chip. The conductive connection, which connects the contact connection, i.e. by way of example a bond pad or a feed line over a foil, to the contact material, is used for current distribution on the radiation out-coupling side.

The functional division means in particular that the contacting of the semiconductor layer sequence can be limited to points at which it is advantageous for the operation of the optoelectronic semiconductor chip. This can be achieved by way of example in that the contact material is arranged in such a way that there is an optimally homogenous power supply over the radiation out-coupling side. The contact material can be optimized with respect to its contact resistance at the radiation out-coupling side. At the same time the conductive connection can be optimized in such a way that it has good transverse conductivity. It can, moreover, be optimized with respect to its effect on the optical behavior of the optoelectronic component. It may thus be achieved by way of example that there are fewer optically passive regions on the radiation out-coupling side.

Both the contact material and the conductive connection are metallic, i.e. they comprise a metal or a metal alloy or are made by way of example of a metal or metal alloy.

In other words, it is a basic idea of the invention that greater flexibility is allowed in the optimization of different demands due to a functional separation of the electrical contacting of the semiconductor chip from a distribution of the power supply. The electrical contacting can thus be optimized by way of example with respect to a homogenous current injection and a low contact resistance. The power supply can in particular be optimized with respect to a low feed line resistance and low shading of the radiation out-coupling side or low absorption of the radiation emitted by the semiconductor layer sequence. In one embodiment one area of the contact material is smaller than an area of the conductive connection in projection onto the radiation out-coupling side.

Both the contact material and the conductive connection are metallic, i.e. they comprise a metal or a metal alloy or are made by way of example of a metal or metal alloy.

Metals or metal alloys with high electrical conductivity by way of example may be considered as materials for the conductive connection. Metals or metal alloys with materials such as Al, Ag, Au, Cu, Ti, Pt, etc. are conceivable. Alloys such as AuGe may also be used. It is also conceivable for multi-layer metallization layers to be applied as the conductive connection to reduce diffusion processes, by way of example a layer of TiWN can be applied to the radiation out-coupling side as a diffusion barrier. A gold layer by way of example may be applied as a conductive material to the diffusion barrier.

The contact material comprises metals having a high reflection coefficient for the emitted radiation. A good contact resistance of the contact material with the semiconductor materials used in the optoelectronic semiconductor chip is also important. Suitable materials for the contact material are metals, such as Ag, Ti, Pt, Au, alloys, such as AuGe and AuZn or even transparent conductive oxides (TCO), such as indium tin oxide (or ITO). Good adhesion of the contact material to the semiconductor layer sequence can be aimed for in this connection and influencing of the semiconductor layer sequence by way of a reduction in the development of defects may be avoided. Suitable measures and a large number of further suitable materials are known to a person skilled in the art from his expert knowledge.

The materials used for the contact material or conductive connection are advantageously reflective in the spectral range of the electromagnetic radiation, i.e. that it has a reflection coefficient of more than 0.5. Reflective materials, such as platinum, aluminum, gold or silver, may be used for this purpose by way of example. It is also conceivable for a reflective material to be introduced into the metal or for the metal to be coated with a reflective material. The reflective material can contain titanium dioxide or zinc dioxide by way of example.

By using a reflective material, radiation, which is produced below the contact material or conductive connection, is reflected back into the active layer and can thus be out-coupled by multiple reflection or scattering at a different point of the radiation out-coupling side. Overall efficient radiation of a large part of the radiation produced in the active layer is achieved thereby. A particularly energy efficient optoelectronic semiconductor chip is thus provided.

A dielectric is an electrically weakly conductive or non-conductive, non-metal substance whose charge carriers are generally not freely moving. Additional properties may also be considered when choosing a dielectric. By way of example it is advantageous for the dielectric to be transparent in the wavelength ranges in which the optoelectronic semiconductor emits radiation. The optical refractive index may also be relevant to the choice of dielectric. The dielectric can be applied as a dielectric layer. The following materials by way of example are used as a dielectric in optoelectronic semiconductors:

silicon nitride,
silicon dioxide,
silicon oxinitride,
aluminum oxide.

In one embodiment the conductive connection includes a conductive web structure. Various geometries can be produced as a result which allow a certain distribution of the supplied electrical current on the radiation out-coupling side.

In one embodiment the conductive connection includes a transparent conductive layer. The conductive connection hardly affects the radiation out-coupling via the radiation out-coupling side as a result. The transparent conductive layer typically includes a transparent conductive oxide (TCO), such as ITO.

In one embodiment a dielectric is provided at least in certain sections between the conductive connection and the radiation out-coupling side. The conductive connection is consequently spaced apart from the radiation out-coupling side. A large part of the radiation is reflected back into the semiconductor layer sequence owing to total reflection at the boundary with the dielectric. This radiation can be out-coupled via a different point of the radiation out-coupling side, over which no section of the conductive connection is arranged.

In one embodiment the contact material is distributed over the radiation out-coupling side in such a way that an optimally homogeneous current density is achieved over the semiconductor chip. Such a distribution takes account by way of example of a drop in voltage in the conductive connection. The contact resistance to the radiation out-coupling side can be regulated by the distribution. An optimally even injection of current via the radiation out-coupling side can thus be striven for as an optimum aim.

In one embodiment the contact material comprises a large number of separate contact zones, in particular contact points. A suitable distribution of the contact material over the radiation out-coupling side can be selected as a result.

In one embodiment the contact points are unevenly distributed over the radiation out-coupling side. In one embodiment the contact points have different sizes. Both measures are suitable for adjusting a distribution of the current injection over the radiation out-coupling side according to different optimization aims.

Various embodiments of the method for fabricating an optoelectronic semiconductor chip comprise the following steps:

providing a semiconductor layer sequence with a radiation out-coupling side, applying a metal contact material to the radiation out-coupling side, applying a metal conductive connection to the contact material.

In various embodiments a dielectric layer and/or a conductive layer is firstly applied to the radiation out-coupling side.

Both layers are advantageously transparent for radiation produced in the semiconductor layer sequence. In various embodiments the respectively applied layer is opened at certain points, by way of example by a photolithographic process and etching, and is introduced into the opening of the contact material for contacting of the radiation out-coupling side.

BRIEF DESCRIPTION OF THE DRAWINGS

Various exemplary embodiments of the inventive solution will be described in more detail hereinafter with reference to the drawings. In the figures the first number(s) of a reference numeral indicate the figure in which the reference numeral is first used. The same reference numerals are used in all figures for similar elements or elements or properties with the same action.

In the drawings.

DETAILED DESCRIPTION OF THE DRAWINGS

Figure 1:
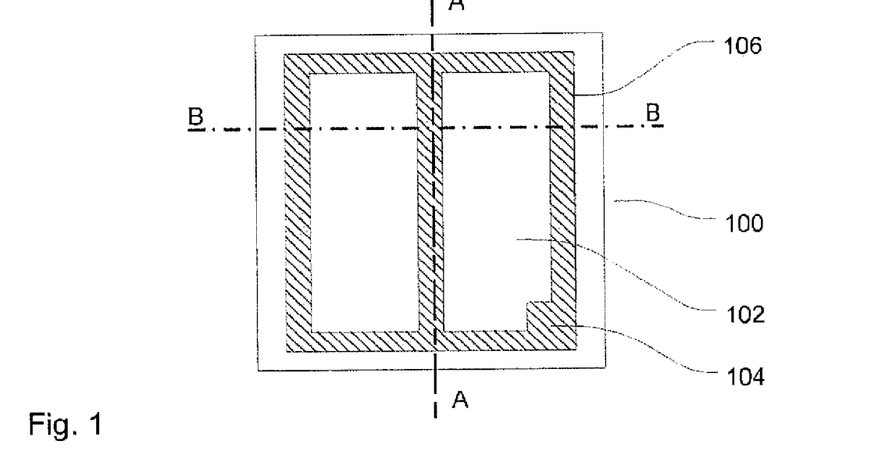
FIG. 1 shows the schematic illustration of a plan view of a first exemplary embodiment of an optoelectronic semiconductor chip.

FIG. 1 shows the schematic illustration of a plan view of a first exemplary embodiment of an optoelectronic semiconductor chip 100. The semiconductor chip 100 has a radiation out-coupling side 102. Radiation, which is produced in an active zone of the semiconductor chip, is out-coupled via the radiation out-coupling side 102. An electrical current is also supplied via the radiation out-coupling side 102 and this causes emission of electromagnetic radiation in the active zone. The electrical current is supplied via a contact connection 104 and is distributed over the radiation out-coupling side 102 via a conductive connection 106. The contact connection 104 is designed by way of example as a bond pad which can be connected to a bond wire. The conductive connection 106 is by way of example a conductive web structure in the form of an applied metallization. The conductive connection 106 is used to distribute the electrical current, so this can be injected into the semiconductor layer sequence of the optoelectronic semiconductor chip 100 via the radiation out-coupling side 102 so as to be optimally homogenously distributed. For this purpose the conductive connection 106 is connected to a semiconductor layer sequence of the optoelectronic semiconductor chip 100. This connection is described in more detail with reference to FIG. 2 and FIG. 3.

Figure 2:
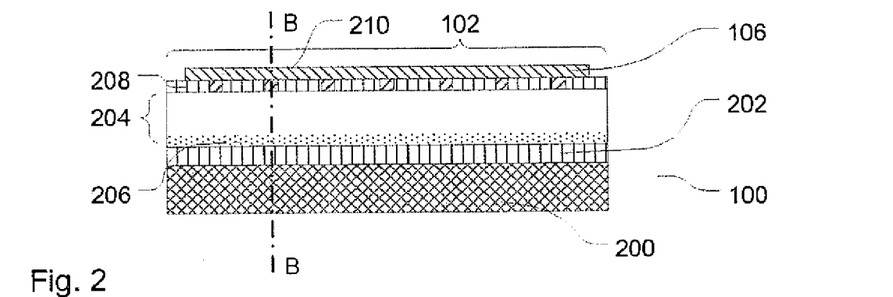
FIG. 2 shows the schematic illustration of the semiconductor layer construction of the optoelectronic semiconductor chip in FIG. 1 along a cutting axis A-A.

FIG. 2 shows the schematic illustration of the semiconductor layer construction of the optoelectronic semiconductor chip 100 along a cutting axis A-A. In the illustrated exemplary embodiment the optoelectronic semiconductor chip 100 is designed as a thin film light-emitting diode chip. This embodiment will only be illustrated schematically hereinafter. A basic principle of a thin film light-emitting diode chip is illustrated, by way of example, in document [1] whose disclosure is hereby incorporated in this regard into the description by reference. Further examples of a thin film light-emitting diode chip are known from documents [2] and [3] whose disclosures are hereby also incorporated in this regard into the description by reference.

The semiconductor chip 100 has an electrically conductive contact layer 200. It typically includes a metal or a layer sequence of conductive materials, by way of example a layer sequence which comprises one or more metals or a TCO. The electrically conductive contact layer 200 can be applied to a carrier, not shown in FIG. 2, such as a silicate glass, a Ge substrate or a silicon substrate. It may also be self-supporting as shown in the exemplary embodiment. In the exemplary embodiment the contact layer 200 is simultaneously highly reflective in the wave range of the radiation emitted by the optoelectronic semiconductor chip 100, so the contact layer 200 also serves as a reflector layer. It is also possible for an additional thin, likewise electrically conductive reflector layer to be applied to the contact layer 200. Doped semiconductors and metal materials may be considered as possible materials for the contact layer 200. A silver layer by way of example can be used as contact layer 200.

A separating layer 202 is applied to the contact layer 200. The separating layer 202 includes a dielectric material, such as SiN or $SiO_2$. It separates the contact layer 200 from a semiconductor layer sequence 204. The contact layer 200 and the semiconductor layer sequence 204 are electrically insulated from each other by the separating layer 202. Electromagnetic radiation is produced in the semiconductor layer sequence 204 when an electric current is injected. For this purpose the semiconductor layer sequence 204 can include a pn junction, a double hetero structure or a quantum well structure such as a single quantum well (SQW) or multi quantum well (MQW) for producing radiation. A pn junction with a depletion zone 206 is indicated in FIG. 2.

A passivation layer 208 is applied to the semiconductor layer sequence 204. The radiation produced in an active zone of the semiconductor layer sequence 204 is out-coupled via the passivation layer 208. The passivation layer 208 covers the radiation out-coupling side 102. The contact connection 104 is applied to the passivation layer 208. The contact connection 104 is electrically insulated from the semiconductor layer sequence 204 by the passivation layer 208. Furthermore, the passivation layer may also be used for optical functions, by way of example as an anti-reflective treatment. There is consequently advantageously no flow of current from the contact connection 104 into the semiconductor layer sequence 204 and no radiation is produced immediately below the contact connection 104. Absorption of radiation at the contact connection 104 is also reduced by a reflection at the passivation layer 208. Overall the efficiency of the optoelectronic semiconductor chip 100 is thus increased.

The conductive connection 106 is also applied to the passivation layer 208. At some points below the conductive connection 106 the passivation layer 208 is open. Contact points, by way of example a contact point 210, are arranged in the openings. The conductive connection 106 is electrically connected to the semiconductor layer sequence 204 by the contact point 210. All of the contact points serve to supply an electrical current into the semiconductor layer sequence 204 thereby. The function of the conductive connection 106 of distributing the electrical current over the radiation out-coupling side 102 is separated therefrom.

Both the conductive connection 106 and the contact points, such as contact point 210, should include materials with high electrical conductivity. They may by way of example be metals, metal alloys or doped semiconductor materials.

The contact points are completely covered by the conductive connection 106, so they are encapsulated by it and the passivation layer 208. The contact points are thus protected from degradation due to external influences, by way of example due to oxidation.

The spacings of the contact points are shown as being constant and of equal length. They can, however, vary over the surface of the radiation out-coupling side 102 in other exemplary embodiments to thus equalize a voltage drop along the conductive connection 106 such that a homogeneous current density is achieved over the chip surface.

In some embodiments the sizes of the contact points are not homogeneous but vary over the surface of the radiation out-coupling side 102. It may consequently be ensured that an optimally homogeneous current density is injected into the semiconductor layer sequence 204 via the surface of the radiation out-coupling side 102.

The conductive connection 106, together with the contact points, i.e. contact point 210 as well, forms a first electrode of the optoelectronic semiconductor chip 100. This electrode can be the anode or cathode, by way of example as a function of the arrangement of a pn junction in the semiconductor layer sequence 204. The embodiment of the second electrode of the optoelectronic semiconductor chip 100 becomes clear with the aid of the illustration in FIG. 3.

Figure 3:
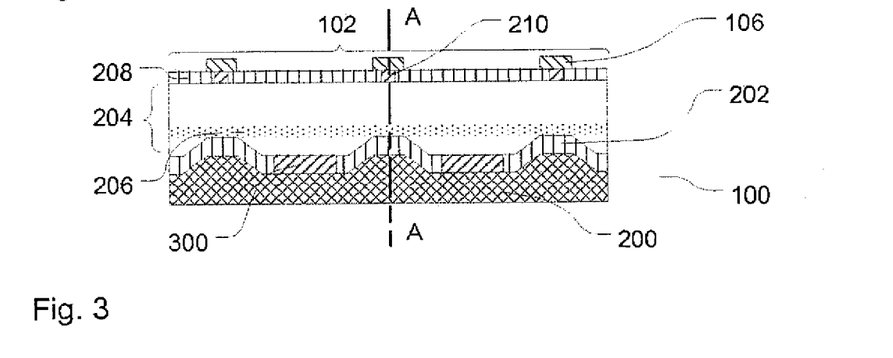
FIG. 3 shows the schematic illustration of the semiconductor layer construction of the optoelectronic semiconductor chip in FIG. 1 along a cutting axis B-B.

FIG. 3 shows the schematic illustration of the semiconductor layer construction of the optoelectronic semiconductor chip 100 along a cutting axis B-B. The semiconductor layer construction is substantially identical to the layer sequence of the cut along the cutting axis A-A, as shown in FIG. 2. In contrast to the cut along the cutting axis A-A, however, openings are provided in the separating layer 202 in the cut B-B. The connecting layer 300 electrically connects the contact layer 200 to the semiconductor layer sequence 204. Together with the contact layer 200 the connecting layer 300 therefore forms the second electrode of the optoelectronic semiconductor chip 100. No connecting layer 300 is provided at points below the conductive connection 106 and therewith also below the contact points, by way of example contact point 210, and instead the contact layer 200 is electrically insulated there from the semiconductor layer sequence 204 by the separating layer 202. Consequently no radiation is produced below the conductive connection 106 in the semiconductor layer sequence 204. Radiation is produced therewith in particular in regions in which the radiation can be readily out-coupled via the radiation out-coupling side 102. However, the first electrode is also optimized from an optical perspective. The conductive connection 106 by way of example is for the most part underlaid by the passivation layer 208, as is clear from FIGS. 1 to 3. The radiation produced below the conductive connection 106 or in a surrounding region does not reach the conductive connection and cannot be absorbed there due to total reflection. Optical losses are reduced thereby. Instead the radiation reflected in this way is reflected back in zones from which it is highly probably out-coupled via the radiation out-coupling side 102. Optical losses are reduced thereby. The overall optical efficiency of the optoelectronic semiconductor chip 100 is also increased by choosing material for the contact points which has a high reflectivity for the radiation produced in the semiconductor layer sequence 204. A large part of the radiation produced is out-coupled via the radiation out-coupling side 102.

The provision of a separating layer 202 is not imperative in this case. The semiconductor layer sequence 204 can completely adjoin the connecting layer 300, or directly adjoin the contact layer 200 without a separating layer 202 or a connecting layer 300 having to be provided. In this case a current is injected on the entire side of the semiconductor layer sequence 204 that faces away from the radiation out-coupling side 102. Greater efficiency than in the case of known optoelectronic semiconductor chips is already produced solely by the measures on the radiation out-coupling side 102.

Figure 4:
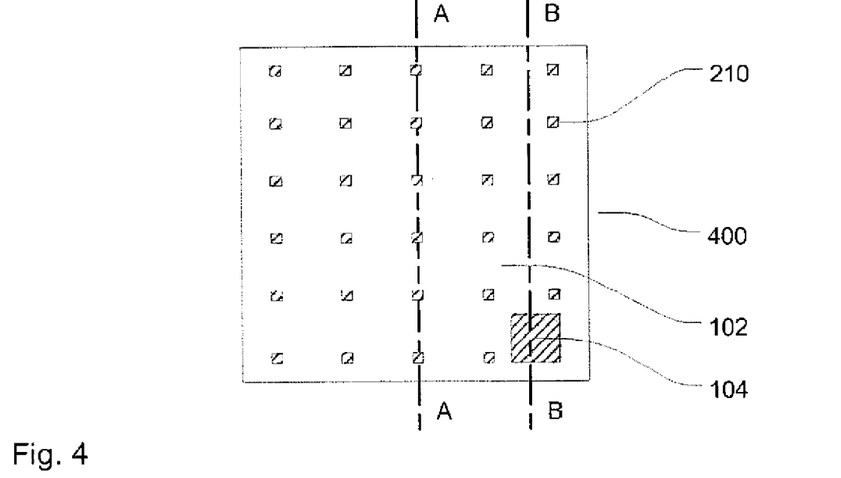
FIG. 4 shows the schematic illustration of a plan view of a second exemplary embodiment of an optoelectronic semiconductor chip.

FIG. 4 shows the schematic illustration of a plan view of a second exemplary embodiment of an optoelectronic semiconductor chip. The optoelectronic semiconductor chip 400 differs significantly from the first exemplary embodiment in FIGS. 1 to 3 in that a transparent feed line layer is applied as a conductive connection on the radiation out-coupling side 102. A contact connection and a plurality of contact points, by way of example a contact point 210, are also applied to the radiation out-coupling side 102. The mode of operation of the feed line layer becomes clear in FIG. 5.

Figure 5:
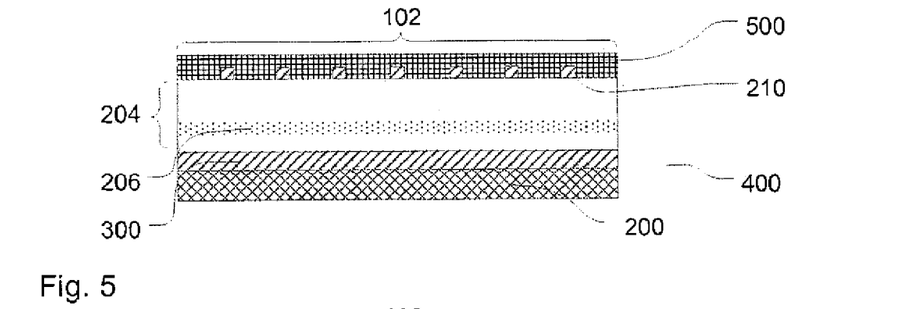
FIG. 5 shows the schematic illustration of the semiconductor layer construction of the optoelectronic semiconductor chip in FIG. 4 along a cutting axis A-A.

FIG. 5 shows the schematic illustration of the semiconductor layer construction of the optoelectronic semiconductor chip according to the second exemplary embodiment in FIG. 4 along a cutting axis A-A. In this case the construction differs from the first exemplary embodiment in particular on the radiation out-coupling side 102. In the exemplary embodiment shown in FIG. 5 a transparent feed line layer 500 is applied to the semiconductor layer sequence 204. The transparent feed line layer 500 is used to distribute current and allows the electromagnetic radiation produced in the semiconductor layer sequence 204 to be out-coupled. The transparent feed line layer 500 is a conductive material which is transparent in the region of the radiation produced. It may be an inorganic or organic material. A typical material is a metal oxide, such as ITO.

The feed line layer 500 covers the semiconductor layer sequence 204, wherein a contact material in the form of contact points, such as contact point 210, is partially provided between the feed line layer 500 and the semiconductor layer sequence 204. The contact points comprise a highly conductive material and are used, as in the first exemplary embodiment, to supply electrical current into the semiconductor layer sequence 204. A substantial proportion of the electrical current can thus be supplied owing to the low contact resistance between contact points and semiconductor layer sequence. The profile of the current injection into the semiconductor layer sequence 204 can be influenced by the density and the distribution of contact points on the radiation out-coupling side 102 and by the size of the contact points. An optimally homogeneous current injection is aimed at in order to produce a homogeneous illuminated image on the radiation out-coupling side 102. The current injection can be optimized therewith by way of the contact points while the current is distributed by way of the transparent feed line layer 500.

Shading due to the contact points can have different effects on the illuminated image depending on the size of the contact points. A dense distribution, by way of example of smaller contact points, may be provided to achieve an optimally homogeneous illuminated image by using a transparent feed line. A substantially smaller current distribution in the upper layer of the semiconductor layer sequence 204, by way of example in an n-doped layer, is also required therewith. A low layer thickness of the semiconductor can in particular be chosen therefore, whereby the fabrication costs may be reduced precisely in the case of an epitaxial growth of the semiconductor layer sequence.

Figure 6:
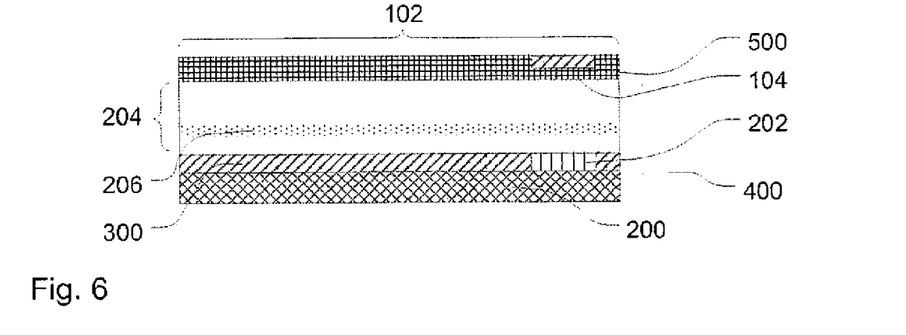
FIG. 6 shows the schematic illustration of the semiconductor layer construction of the optoelectronic semiconductor chip in FIG. 4 along a cutting axis B-B.

The contact connection 104 on the optoelectronic semiconductor chip can be seen in FIG. 6. FIG. 6 shows the schematic illustration of the semiconductor layer construction of the optoelectronic semiconductor chip according to the second exemplary embodiment in FIG. 4 along a cutting axis B-B. It can be seen that the contact connection 104 is applied to the transparent feed line layer 500. The feed line layer 500 separates the contact connection 104 from the semiconductor layer sequence 204 thereby. The direct flow of current from the contact connection 104 into the semiconductor layer sequence 204 is reduced thereby. The separating layer 202 is provided below the contact connection on the side toward the contact layer 200. No luminescence is produced below the contact connection 104 therefore. Unnecessary absorption at the contact connection 104 is reduced thereby. The efficiency of the optoelectronic semiconductor chip is increased thereby.

Figure 7:
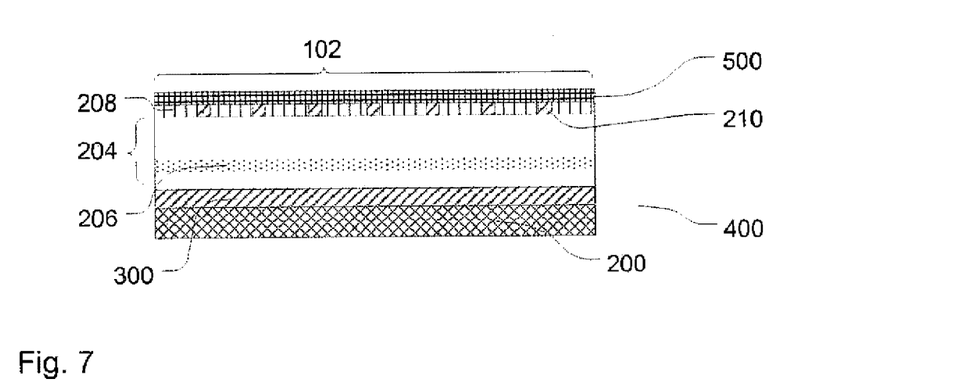
FIG. 7 shows the schematic illustration of a variant of the semiconductor layer construction of the optoelectronic semiconductor chip in FIG. 4 along a cutting axis A-A.

FIG. 7 shows the schematic illustration of a variant of the semiconductor layer construction of the optoelectronic semiconductor chip in FIG. 4 along a cutting axis A-A. The variant in FIG. 7 differs from the variant in FIGS. 5 and 6 in that a passivation layer 208 is provided between the feed line layer 500 and the semiconductor layer sequence 204. Openings are provided in the passivation layer 208 in which one contact point respectively, by way of example a contact point 210, is introduced. The feed line layer 500 is consequently electrically connected by the contact points to the semiconductor layer sequence 204. The current is injected on the radiation out-coupling side 102 via the contact points.

Figure 8:
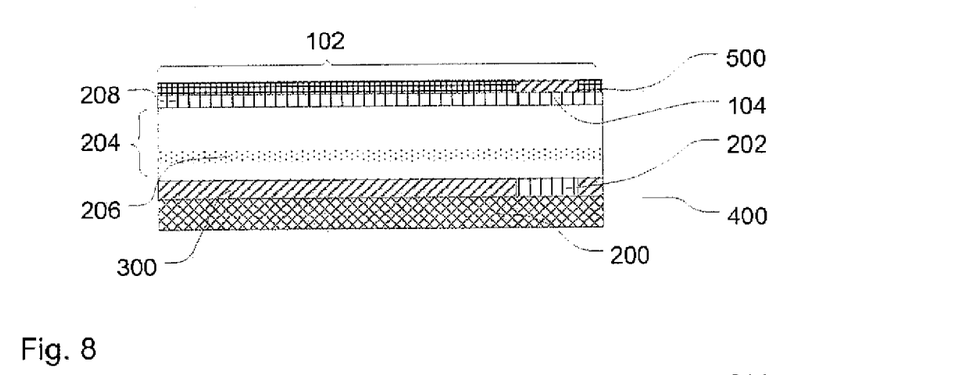
FIG. 8 shows the schematic illustration of a variant of the semiconductor layer construction of the optoelectronic semiconductor chip in FIG. 4 along a cutting axis B-B.

With the aid of FIG. 8 it is also clear how the connecting layer 300 can be changed. This variation is conceivable in connection with all exemplary embodiments of the optoelectronic semiconductor chip even if it is shown in FIG. 8 in connection with the second exemplary embodiment. In this variation the connecting layer 300 connects the contact layer 200 to the semiconductor layer sequence 204 over a large area. This contacting is especially advantageous in connection with a transparent feed line layer 500 in particular since a homogenous and light radiation distribution on the radiation out-coupling side 102 is thus achieved.

Figure 9:
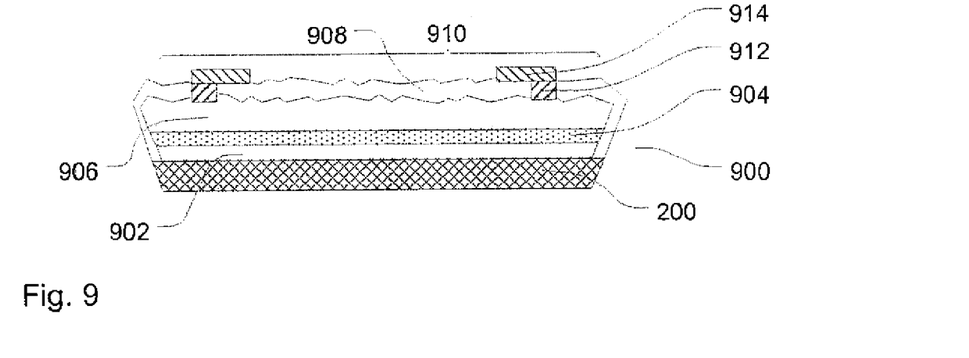
FIG. 9 shows the schematic illustration of a semiconductor layer construction of a third exemplary embodiment of an optoelectronic semiconductor chip.

FIG. 9 shows the schematic illustration of a cross-section through a third exemplary embodiment of an optoelectronic semiconductor chip. The optoelectronic semiconductor chip 900 includes a quantum well structure as the active zone in the semiconductor layer sequence. This is shown by way of example with the aid of a GaN/InGaN/GaN layer sequence.

The optoelectronic semiconductor chip 900 includes a contact layer 200 on which a semiconductor layer sequence is arranged. The contact layer 200 is used as an electrode of the optoelectronic semiconductor chip 900. It accordingly contains a material with low contact resistance, such as a metal, by way of example silver (Ag). A doped semiconductor material is equally conceivable. Because the side of the optoelectronic semiconductor chip 900 on which the contact layer 200 is applied is not used for out-coupling electromagnetic radiation, the contact layer 200 will advantageously have a high reflection coefficient in the region of the radiation produced in the optoelectronic semiconductor chip 900.

A first semiconductor material 902 is arranged on the contact layer 200. The first semiconductor material 902 is by way of example a p-doped gallium nitride (GaN). An active zone 904 is arranged on the first semiconductor material 902. The active zone 904 is made by way of example from a $In_xGa_{(1-x)}N$ semiconductor, where $0 \leq x \leq 1$, and contains a single quantum well. A second semiconductor material 906 is arranged on the active zone 904. The second semiconductor material 906 is doped with a doping agent which has a different polarity to the doping agent of the first semiconductor material. The second semiconductor material 906 is an n-doped GaN by way of example.

The second semiconductor material 906 has a side which faces away from the active zone 904 and which comprises a roughened surface. The electromagnetic radiation produced in the active zone 904 is out-coupled from the semiconductor layer sequence via the roughened surface. The semiconductor layer sequence comprises the first semiconductor material 902, the active zone 904 and the second semiconductor material 906. Particularly efficient out-coupling of the radiation is possible by way of the roughened surface.

The roughened surface and the side surfaces of the semiconductor layer sequence are covered by a passivation layer 908 and are protected in this way from environmental influences. The passivation layer 908 can be made from the same or similar materials as/to the passivation layer 208 in the above-described exemplary embodiments.

To electrically contact the second semiconductor material 906 the passivation layer 908 is open on a radiation out-coupling side 910. A contact material 912 is introduced into the opening. A conductive connection 914 is applied to the contact material and partly on the passivation layer 908. When choosing the materials a low contact resistance, and in the case of the contact material 912, a high reflectivity, is observed respectively, it being possible to use the materials already described in connection with the other exemplary embodiments by way of example.

The contact material 912 is completely covered by the conductive connection 912, so it is encapsulated by it and the passivation layer 908. The contact material 912 is protected from degradation due to external influences thereby, by way of example due to oxidation.

As already illustrated in the preceding description, the function of the contact material 912 is to establish an electrical contact with the semiconductor layer sequence while the conductive connection 914 is used in particular for current distribution over the radiation out-coupling side 910. Both structures can be optimized accordingly. This is shown by way of example with reference to FIGS. 10 and 11.

Figure 10:
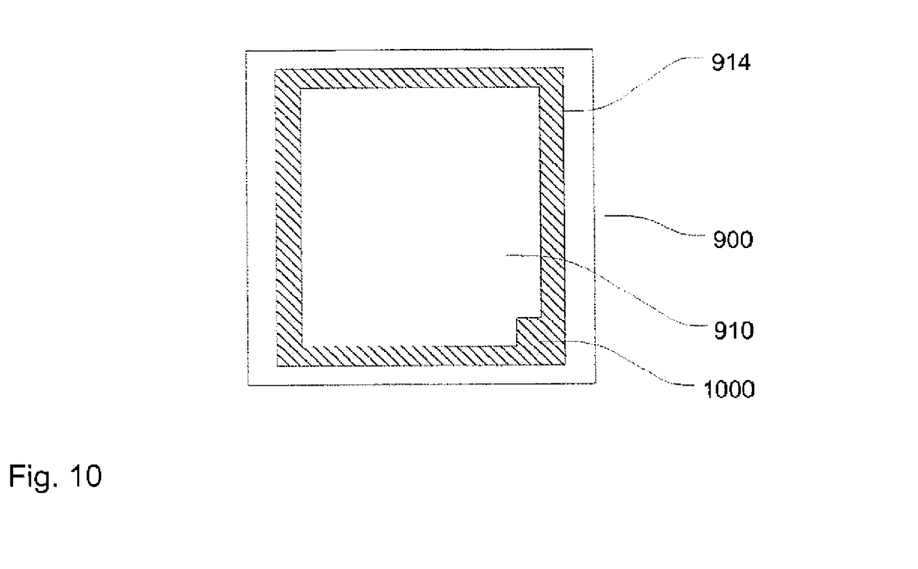
FIG. 10 shows the schematic illustration of a plan view of the third exemplary embodiment of an optoelectronic semiconductor chip.

FIG. 10 shows the schematic illustration of a plan view of the optoelectronic semiconductor chip 900. The embodiment of the conductive connection 914 on the radiation out-coupling side 910 is shown. The conductive connection 914 is electrically connected to a contact connection 1000. The contact connection 1000 is used for contacting the optoelectronic semiconductor chip 900 to a power supply. It is designed by way of example as a bond pad which can be connected to a bond wire.

The conductive connection 914 runs along the radiation out-coupling side 910, wherein optimally low shading of the radiation is observed. Since the function of the conductive connection lies in particular in the distribution of an electrical current supplied via the contact connection 1000, an optimally constant and high conductivity over the entire physical extent of the conductive connection is observed.

Figure 11:
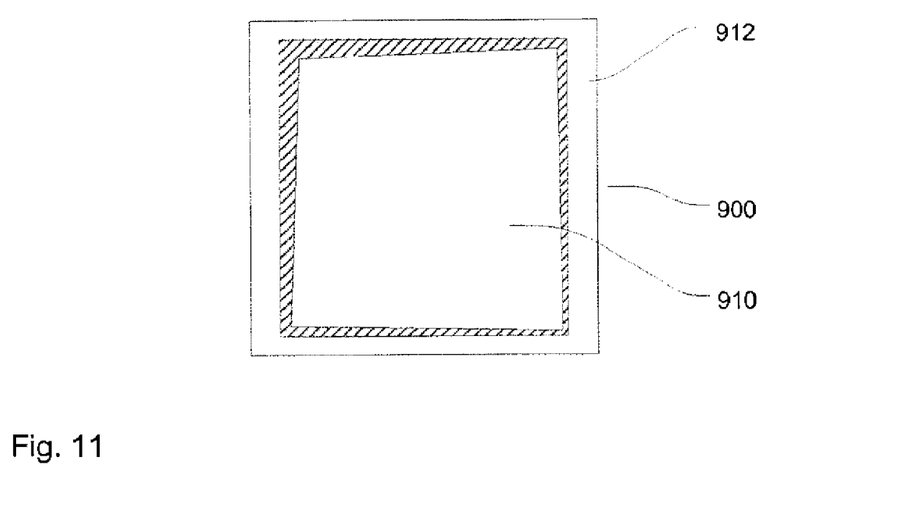
FIG. 11 shows the schematic illustration of a plan view of the third exemplary embodiment of an optoelectronic semiconductor chip omitting the conductive connection and the contact connection.

FIG. 11 shows the schematic illustration of a plan view of the optoelectronic semiconductor 900. The embodiment of the contact material 912 on the radiation out-coupling side 910 is shown in this case. The function of the contact material 912 consists in particular in a homogenous current injection over the radiation out-coupling side 910. In accordance with the drop in potential from the contact connection 100 along the conductive connection 914 and the contact material 912, the contact material 912 therefore has a better connection, by way of example due to the larger contact area, the further a region of the contact material 912 is located from the contact connection 1000. This can be achieved by way of example as illustrated in that the contact material 912 widens starting from the contact connection 1000. A constant current injection and therewith a homogeneous illuminated image is achieved on the radiation out-coupling side as a result.

Exemplary Embodiments of the Fabricating Method

Figure 12:
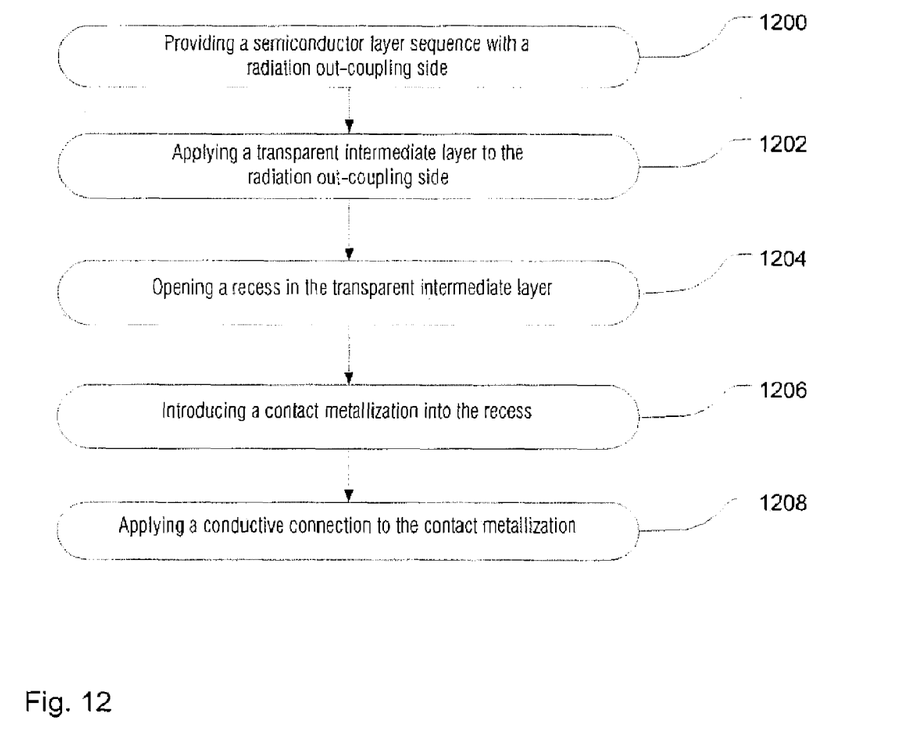
FIG. 12 shows the schematic illustration of the progress of a method for fabricating an optoelectronic semiconductor chip.

FIG. 12 shows the schematic illustration of a method for fabricating an optoelectronic semiconductor chip. The method can be part of a fabricating method which includes known process steps for fabricating a semiconductor chip.

In a first method step 1200 a semiconductor layer sequence is provided which comprises a radiation out-coupling side. The semiconductor layer sequence can be produced by an epitaxial growth. It may have been provided by way of example within the context of a thin film process.

In a second method step 1202 a transparent intermediate layer is applied to the radiation out-coupling side. The intermediate layer can be applied by a known method, by way of example sputtering or a CVD method. The intermediate layer can be a dielectric or a conductive material, by way of example ITO.

A recess is opened in the intermediate layer in a third method step 1204. A contact material is introduced into the recess in a fourth method step 1206. These method steps can include process steps by way of example, such as from photolithography, local opening of the transparent intermediate layer, depositing of the contact material, etc.

A conductive connection is applied to the contact material in a fifth method step.

The method can take place within the context of known method steps. Therefore in one exemplary embodiment, following wafer bonding and following possible mesa etching, an intermediate layer can be deposited on the wafer in the form of a passivation. The passivation is opened in a photo step and a metal alloy introduced as contact material into the opening. The contact material can be raised outside of the opening by removing a photoresist which was last used. The conductive connection can be deposited and structured using a further photographic technique. A contact connection, by way of example a bond pad, is advantageously located on the passivation, so there is no direct flow of current from the contact connection via the radiation out-coupling side and into the semiconductor layer sequence. The absorption at the contact connection is thus kept low.

In a variant of this exemplary embodiment the same material is used for the contact material and for the conductive connection. In this case the photoresist can be removed in a first photo step directly after opening of the passivation and in a further photo step both the contact material and the conductive connection can be deposited in one method step.

In a further exemplary embodiment contact points are applied as the contact material to the radiation out-coupling side. In addition a contact connection can already be applied to the radiation out-coupling side. A transparent conductive layer is then deposited. Provided the contact connection has already been applied, it is then opened at least in the central region of the contact connection. Otherwise a contact connection is applied to the transparent conductive layer. To prevent a direct flow of current below the contact connection and the contact points through to the support side of the semiconductor layer sequence opposing the radiation out-coupling side, the support side is electrically insulated in regions which are located directly below the contact material.

It is possible for a passivation layer to firstly be applied to the radiation out-coupling side and then a transparent conductive layer.

It is possible for the contact material to be directly structured on the radiation out-coupling side. It is also conceivable for a transparent intermediate layer, by way of example a passivation layer and/or a conductive layer, to firstly be applied and for a recess to then be opened into which the contact material is introduced.

Concluding Finding

In order to illustrate the underlying idea the optoelectronic semiconductor chip and the method for fabricating an optoelectronic semiconductor chip have been described with the aid of some exemplary embodiments. The exemplary embodiments are not limited to a specific combination of features. Even if some features and designs have been described only in connection with a particular exemplary embodiment or individual exemplary embodiments, they may be combined with other features from other exemplary embodiments respectively. It is also possible to add individually illustrated features or to omit particular designs in exemplary embodiments provided the general technical teaching is still achieved.

Even if the steps of the method for fabricating an optoelectronic semiconductor chip are described in a specific sequence, it is obvious that each of the methods described in this disclosure can be carried out in any other meaningful sequence, it being possible to also omit or add method steps provided there is no deviation from the basic idea of the described technical teaching.

The invention claimed is:

1. An optoelectronic semiconductor chip, comprising:
   a radiation out-coupling side;
   a contact connection;
   a metal contact material applied to the radiation out-coupling side; and
   a metal conductive connection applied to the contact material and which is connected to the contact connection,
   wherein the conductive connection has a transparent conductive layer,
   wherein the conductive layer includes a transparent metal oxide, and
   wherein a dielectric is provided at least in certain sections between the conductive connection and the radiation out-coupling side.

2. The optoelectronic semiconductor chip as claimed in claim 1, wherein one area of the contact material is smaller than an area of the conductive connection in projection onto the radiation out-coupling side.

3. The optoelectronic semiconductor chip as claimed in claim 1, wherein the contact material is distributed over the radiation out-coupling side in such a way that a optimally homogeneous current density is achieved over the semiconductor chip.

4. The optoelectronic semiconductor chip as claimed in claim 1, wherein the contact material comprises a number of separate contact zones.

5. The optoelectric semiconductor chip as claimed in claim 4, wherein the contact zones are contact points.

6. The optoelectronic semiconductor chip as claimed in claim 5, wherein the contact points have different sizes.

7. The optoelectronic semiconductor chip as claimed in claim 5, wherein the contact points are unevenly distributed over the radiation out-coupling side.

8. An optoelectronic semiconductor chip, comprising:
   a radiation out-coupling side;
   a contact connection;
   a metal contact material applied to the radiation out-coupling side; and
   a metal conductive connection applied to the contact material and which is connected to the contact connection,
   wherein the contact material comprises a number of separate contact zones,
   wherein the contact zones are contact points, and
   wherein the contact points have different sizes.

* * * * *